United States Patent [19]
Paranjpe et al.

[11] Patent Number: 5,591,493
[45] Date of Patent: Jan. 7, 1997

[54] STRUCTURE AND METHOD FOR INCORPORATING AN INDUCTIVELY COUPLED PLASMA SOURCE IN A PLASMA PROCESSING CHAMBER

[75] Inventors: Ajit P. Paranjpe, Plano; Cecil J. Davis, Greenville; Robert T. Matthews, Plano, all of Tex.

[73] Assignee: Texas Instruments Incorporated, Dallas, Tex.

[21] Appl. No.: 472,606

[22] Filed: Jun. 7, 1995

Related U.S. Application Data

[62] Division of Ser. No. 269,414, Jun. 30, 1994.

[51] Int. Cl.⁶ .................................................. C23C 16/00
[52] U.S. Cl. ................ 427/569; 156/643.1; 315/111.51; 427/571; 118/723 I
[58] Field of Search ........................... 118/723 I, 723 IR, 118/723 MP; 156/345, 643.1; 315/111.51; 427/569, 571

[56] References Cited

U.S. PATENT DOCUMENTS

| | | | |
|---|---|---|---|
| 4,361,114 | 11/1982 | Gurev | 118/723 I |
| 4,948,458 | 8/1990 | Ogle | 156/643 |
| 5,036,252 | 7/1991 | Lob | 315/111.51 |
| 5,231,334 | 7/1993 | Paranjpe | 315/111.21 |
| 5,302,420 | 4/1994 | Nguyen | 427/490 |
| 5,346,578 | 9/1994 | Benzing | 156/345 |
| 5,436,528 | 7/1995 | Paranjpe | 315/111.51 |
| 5,439,524 | 8/1995 | Cain | 118/723 E |
| 5,460,707 | 10/1995 | Wellerdieck | 204/298.08 |
| 5,464,476 | 11/1995 | Gibb | 118/723 MP |

FOREIGN PATENT DOCUMENTS

| | | | |
|---|---|---|---|
| 0467046 | 4/1992 | European Pat. Off. | H01J 37/34 |
| 0565960 | 10/1993 | European Pat. Off. | H05H 1/46 |
| 601468 | 6/1994 | European Pat. Off. | H01J 37/32 |
| 62-133724 | 6/1987 | Japan | 427/569 |

*Primary Examiner*—Robert Kunemund
*Assistant Examiner*—Jeffrie R. Lund
*Attorney, Agent, or Firm*—Jacqueline J. Garner; Wade James Brady, III; Richard L. Donaldson

[57] ABSTRACT

A plasma processing chamber 10 having an inductively coupled plasma (ICP) source 12 mounted therein. The ICP source 12 comprises an antenna 14 encapsulated in epoxy 16 and surrounded by housing 18. The antenna 14 and epoxy 16 are hermetically sealed from plasma formation region 30. The antenna 14 is powered by at least one RF power supply 40 through at least one RF matching network 42. Dielectric capping plate 28 separates ICP source 12 from the plasma formation region 30 and may have a plurality of holes therein to provide a uniform showerhead distribution of process gases.

7 Claims, 6 Drawing Sheets

STRUCTURE AND METHOD FOR INCORPORATING AN INDUCTIVELY COUPLED PLASMA SOURCE IN A PLASMA PROCESSING CHAMBER

CROSS-REFERENCE TO RELATED APPLICATIONS

This is a division of application Ser. No. 08/269,414, filed on Jun. 30, 1994.

The following related patent application is hereby incorporated by reference:

| Ser. No. | Filing Date | Title |
| --- | --- | --- |
| 08/097,498 | 7/26/93 | PLASMA SOURCE AND METHOD OF MANUFACTURING |

Now U.S. Pat. No. 5,436,528, issued 07/25/95.

TECHNICAL FIELD OF THE INVENTION

This invention relates in general to semiconductor processing equipment and more particularly to an inductively coupled plasma source in a plasma processing chamber.

BACKGROUND OF THE INVENTION

Inductively coupled plasmas ("ICPs") generated with radio frequency ("RF") waves having a frequency generally between 1 MHz and 100 MHz are capable of providing charged particle (electron and ion) concentrations in excess of $10^{11}$ cm$^{-3}$ and ion currents to wafer substrates in excess of 5 mA/cm$^2$. The ICP source is thus competitive with electron cyclotron resonance ("ECR") plasma sources for plasma processing applications in integrated circuit manufacturing processes. Inductively coupled RF plasma sources have advantages over both capacitively coupled RF plasma sources and ECR plasma sources.

In contrast to capacitive RF coupling, inductively coupled RF plasmas have substantially lower intrinsic plasma potentials (<50 V) and achieve a substantially higher ionization efficiency (>0.5%). Also, the intrinsic plasma potential is relatively independent of the RF power. The low intrinsic plasma potential is useful in applications where high ion energies cannot be tolerated.

As in the case of ECR systems, the ion energy of an inductively coupled RF plasma can be varied independently by biasing the integrated circuit wafer with a separate RF power supply. The ICP source, however, has the advantage of operating over a pressure range that is more compatible with process requirements (1 mTorr to 50 mTorr). An ECR source is most effective at pressures below 10 mTorr. In addition, the ICP source can provide a larger diameter (15 cm to 30 cm), homogeneous plasma, in a compact design, and at substantially lower cost than an ECR source. Since the operating pressure is higher, the pumping requirements for a given gas flow rate are more modest.

A first type of prior plasma source employing RF induction coupling, couples energy into the plasma through whistler or helicon waves. This source is called a helicon plasma source. In the presence of a magnetic field ranging from 100 G to 1 kG directed along the axis of the source, a standing whistler wave can be excited by applying an RF voltage to a loop antenna located around the source cavity. Although these axial magnetic fields are generally weaker than the magnetic fields employed in ECR sources, the plasma is non-uniform across the diameter of the source. Thus, the wafer must be located away or "downstream" of the source, in a region where the plasma is sufficiently uniform. This requires the input power of the source to be increased to maintain a sufficient plasma density (i.e., electron and ion concentration) at the downstream position. Also, large solenoidal coils are required to generate the axial magnetic field. These increase source cost and complexity.

A second type of prior plasma source differs from the generic whistler wave or helicon source by omitting the axial magnetic field. The wafer can therefore be placed within the plasma generation region. Even though the peak plasma densities ($5 \times 10^{11}$ cm$^{-3}$) for such a source are about an order of magnitude lower than those for the whistler wave source, the proximity of the wafer to the source ensures that processing rates are comparable. Etch rates of over 1 μm/min are possible for many materials of interest. This source is simpler, more compact, and cheaper than the helicon plasma source.

The second type of induction plasma source employs a multi-turn pancake coil located along the top surface of a cylindrical vacuum chamber. A quartz vacuum window, typically 0.5 in. thick, isolates the coil from the chamber. When the coil is powered by an RF source, large currents circulate in the coils. These currents induce intense electric fields inside the chamber that sustain the plasma.

The time-varying magnetic and electric fields generated by a pancake coil are proportional to the coil current, and scale as the square of the number of coil turns. The uniformity of the induced field improves with increasing coil turns. However, the inductance of the coil is proportional to the square of the number of coil turns. This implies that the voltage drop across the coil increases with an increasing number of coil turns for a fixed coil current. As an example, the voltage drop across a 5 μH coil for an RMS current of 20 A at 13.56 MHz is 8.5 kV. Such a high voltage is a hazard and results in capacitive energy coupling between the coil and the plasma. Capacitive coupling is undesirable because the intrinsic plasma potential increases dramatically if a significant amount of energy is transferred via capacitive coupling. These issues constrain the number of coil turns to about three in prior RF plasma sources.

SUMMARY OF THE INVENTION

In accordance with the present invention a plasma source and method of manufacture are provided which substantially eliminate or reduce disadvantages and problems associated with prior plasma sources.

A plasma processing structure comprising a plasma processing chamber and an inductively coupled plasma source mounted therein. The inductively coupled plasma source includes a hermetically sealed encapsulated antenna. Various embodiments are disclosed including using a planar or conical antenna, having a dielectric capping plate which may be conical in shape, and adding electrically conducting rings to the surface of a housing that surrounds the antenna. In addition, RF power may be supplied to the antenna through one or more RF matching networks from one or more RF power supplies.

A technical advantage of the invention is providing a method for incorporating an inductively coupled plasma source in a generic plasma processing chamber.

A further advantage of the invention is providing an inductively coupled plasma source having an encapsulated antenna assembly that is hermetically sealed.

A further advantage of the invention is providing an inductively coupled plasma source connected to a plurality of RF tuners and/or generators.

These and other advantages will be apparent to those skilled in the art having reference to the specification in conjunction with drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–12 of the drawings, like numerals being used for like and corresponding pans of the various drawings.

Figure 1:
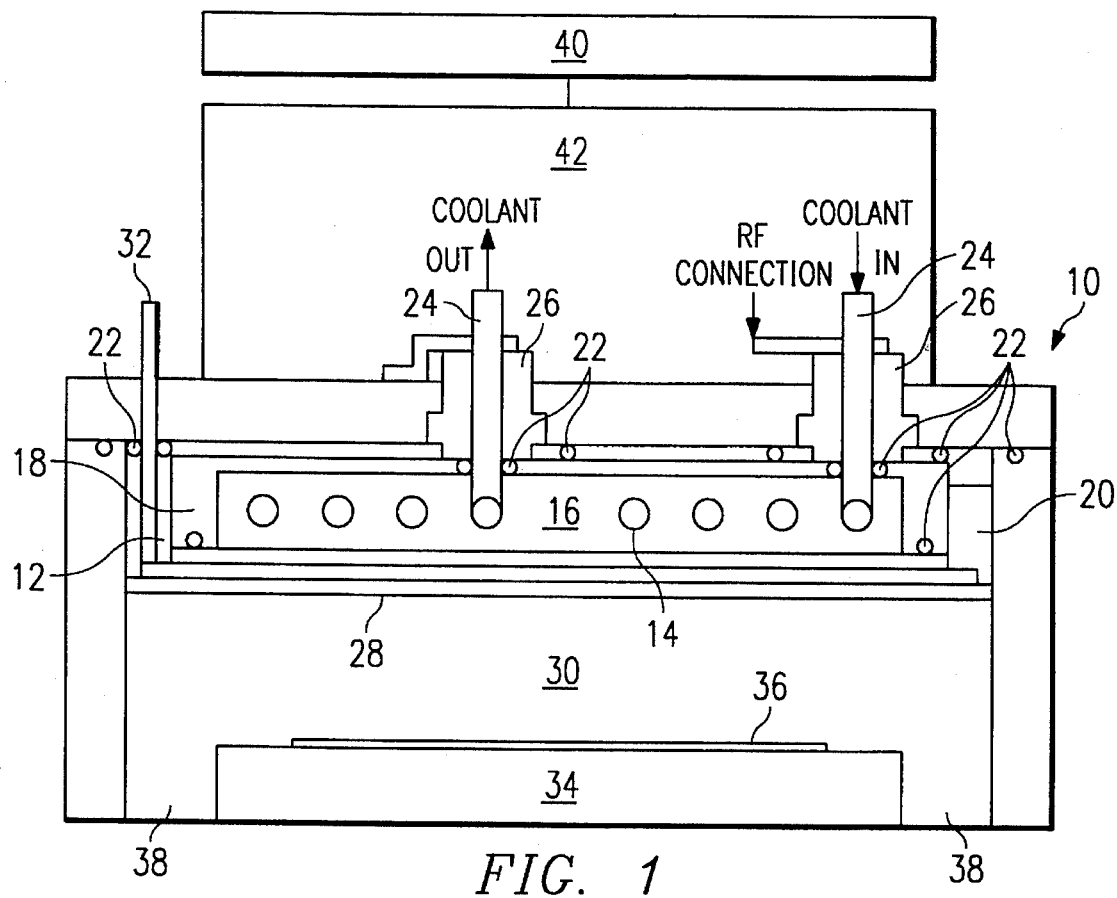
FIG. 1 depicts a partially cross-sectional, partially schematic diagram of a plasma processing chamber employing the disclosed plasma source.

FIG. 1 depicts a partially cross-sectional, partially schematic diagram of a generic plasma processing chamber 10 modified to include an inductively coupled plasma (ICP) source 12 according to the invention. ICP source 12 consists of an antenna 14 encapsulated in an epoxy 16 and hermetically sealed in housing 18. Housing 18 is made of materials that are structurally rigid and resistant to the plasma environment such as ceramics. Epoxy 16 is preferably a general purpose epoxy encapsulant, but any suitable encapsulant may be used. The antenna 14 typically comprises aluminum tubing and may be segmented with capacitors installed between adjacent segments of aluminum tubing in order to reduce the effective coil impedance as described in detail in U.S. Pat. No. 5,231,334, issued Jul. 27, 1993, assigned to Texas Instruments, Inc. and hereby incorporated by reference.

Still referring to FIG. 1, hermetic sealing of the antenna 14 can be achieved by using a series of O-rings 22 to prevent the epoxy 16 from interacting with the plasma environment. Other methods of hermetic sealing will be apparent to those skilled in the art. Hermetic sealing is desirable since most epoxies are attacked by the highly reactive environment produced by the plasma.

The entire housing 18 is located within the vacuum environment of the process chamber 10 and is preferably bolted to the upper wall of the process chamber 10. At least two leads 24 of the antenna 14 penetrate the upper wall of the chamber 10 through insulating bushings 26. Insulating bushings 26 preferably comprise a ceramic. Housing 18 may optionally be surrounded by a metal shield 20 if needed to prevent plasma formation behind and around the housing 18. Also shown in FIG. 1 are other components of a generic process chamber 10 such as chuck 34 for holding wafer 36 and the pump out ports 38.

Figure 2:
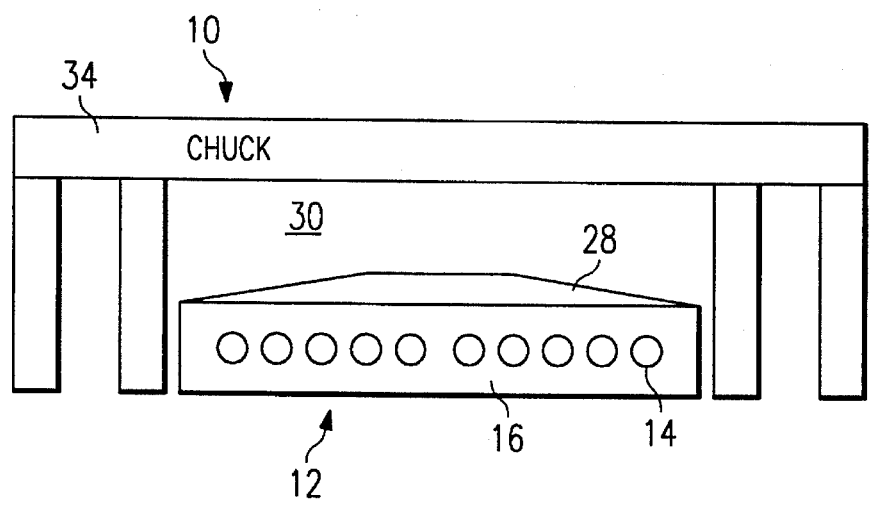
FIG. 2 illustrates an alternative configuration having a contoured dielectric capping plate adjacent the plasma source.

A dielectric capping plate 28 separates the surface of housing 18 from plasma formation region 30. Dielectric capping plate 28 may also be made of ceramic. If desired, dielectric capping plate 28 may have a plurality of holes (not shown) so that it may serve as a showerhead for uniform distribution of process gases which may enter the process chamber 10 at gas inlet 32. Optimized showerhead hole patterns for uniform gas distribution are well known in the art. The shape of dielectric capping plate 28 may be contoured to provide better process uniformity. For example, dielectric capping plate 28 may be conical in shape as shown in FIG. 2. Contouring the dielectric capping plate 28 affects the plasma distribution in two ways. First, contouring alters the shape of the plasma formation region 30. Second, contouring changes the electromagnetic field distribution in the plasma and provides the ability to tailor the ion flux uniformity.

Figure 3:
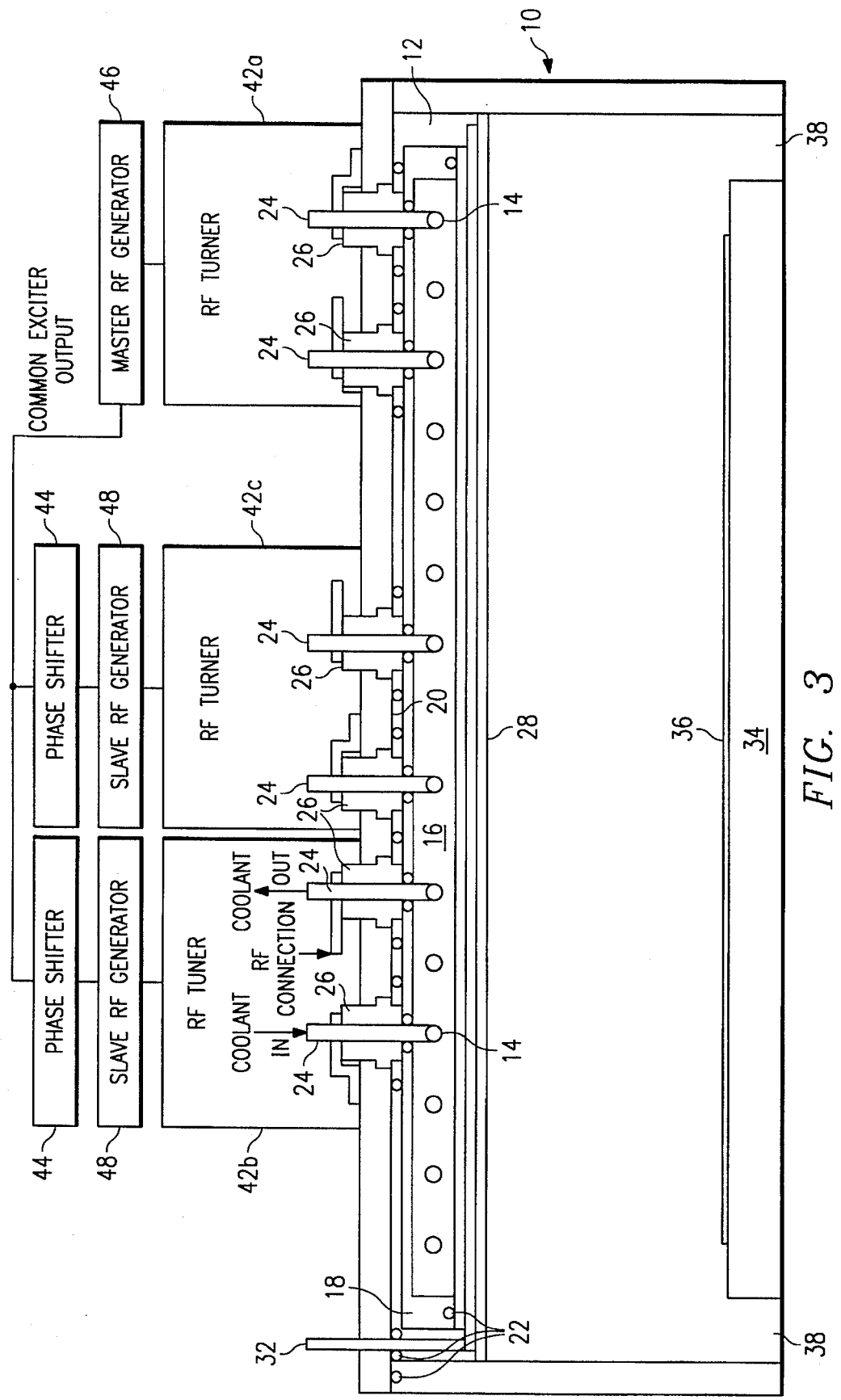
FIG. 3 illustrates an alternative embodiment plasma source for large area plasmas.

Referring back to FIG. 1, the antenna 14 is powered by an RF supply 40 through a RF matching network 42. The RF matching network 42 may be installed directly over the upper wall of the process chamber as shown in FIG. 1. This will keep the electrical lead lengths between the antenna 14 and the matching network 42 to a minimum. If the process chamber 10 has a large diameter, for example, for processing large diameter wafers, several RF matching networks 42a–c may be used as shown in FIG. 3. Having multiple networks 42a–c reduces the impedance to be driven by each network 42a–c. For example, a fast RF matching network 42a may be connected to the outermost coils. A second RF matching network 42b may be connected to the intermediate coils and a third RF matching network 42c may be connected to the innermost coils. As shown in FIG. 3, a separate supply 46,48 (or generator) may be connected to each RF matching network 42a–c. The supplies 46,48 are preferably connected in a master-slave configuration having a phase shifter 44 between a master generator 46 and each of the slave generators 48. The phase shifter 44 is used to adjust the relative phases between the generators 46, 48 to minimize the interaction between them. Alternatively, however, one generator 40 or 46 may be connected to several or all of the matching networks 42a–c.

Figure 4:
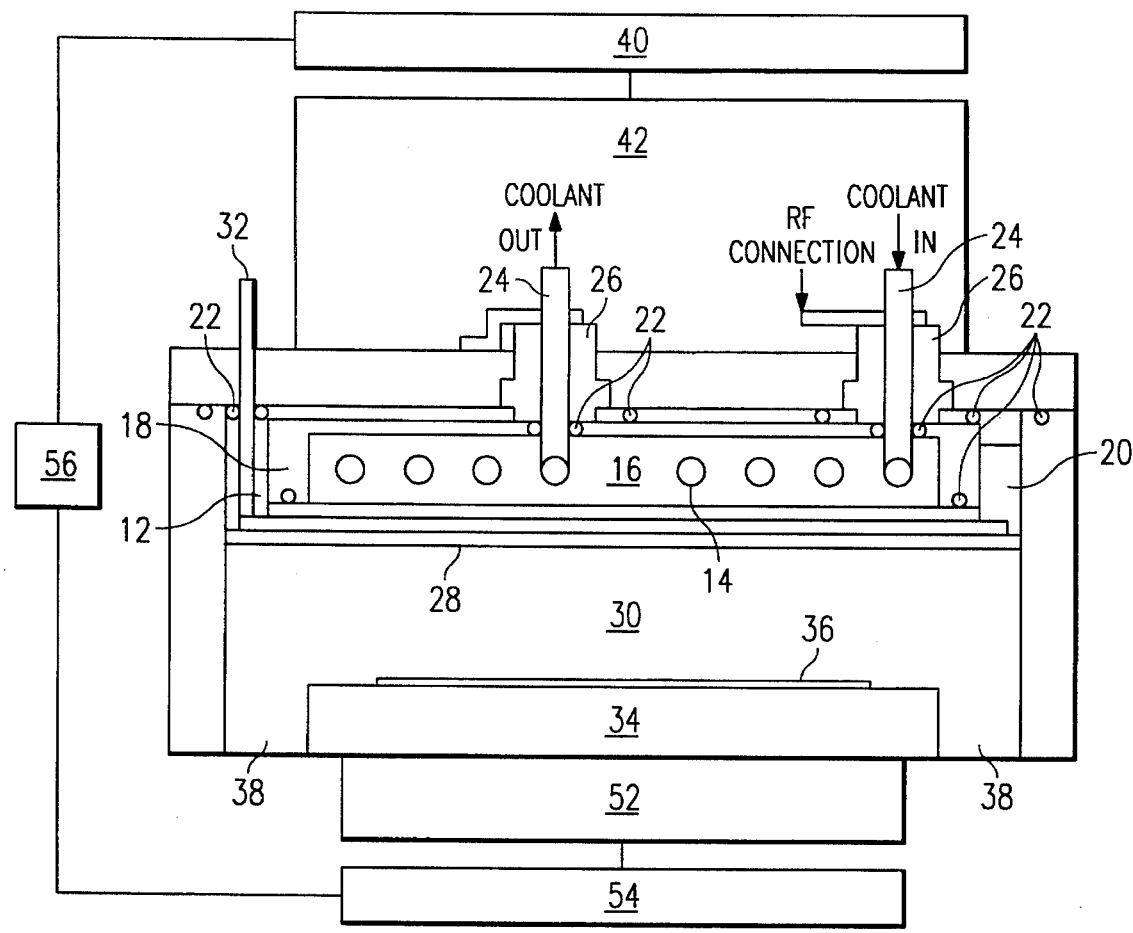
FIG. 4 illustrates an alternative embodiment plasma source having a master-slave link between the RF power supplies for the plasma source and wafer chuck.

Referring to FIG. 4, the chuck 34 is typically connected to a RF power supply 54 through a matching network 52. The chuck 34 and antenna 14 are typically powered by separate RF supplies. When the same RF frequency is desired for both the chuck 34 and the antenna 14, the power supplies need to be operated in a master-slave configuration similar to the one shown in FIG. 3, with the supply 40 for the antenna 14 serving as the master generator. A variable phase shifter 56 is inserted in the master-slave link, and the relative phases of the two generators 40, 54 is adjusted to minimize interactions between them.

In operation, the desired process gas (or gases) is supplied to gas inlet 32. The antenna 14 is powered by RF power supply 40 (or 46 and 48) to produce large currents that circulate in the coils of antenna 14. These cents induce intense electric fields inside the chamber 10 in plasma formation region 30. When the process gas supplied through gas inlet 32 flows through the showerhead holes in dielectric capping layer 28 and into the electric field generated by the currents in antenna 14 a plasma is created and sustained. The plasma then reacts with the surface of wafer 36 in the conventional manner. Because antenna 14 is hermetically sealed, the plasma created does not react with epoxy 16. In addition, plasma formation behind and around housing 18 may be prevented if desired by the use of metal shield 20.

Figure 5:
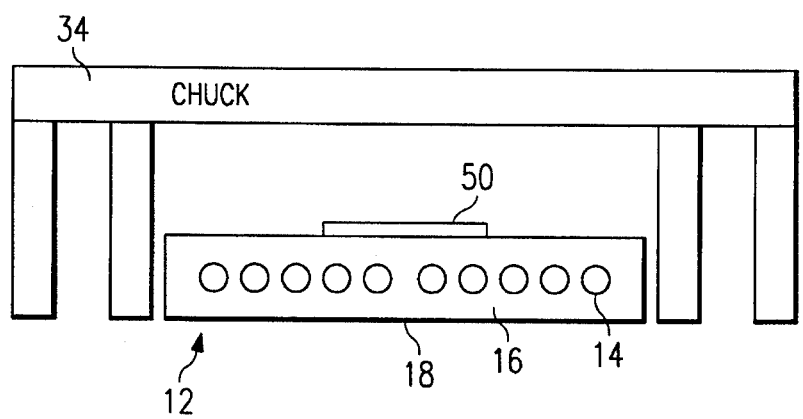
FIG. 5 illustrates an alternative configuration of the plasma source having electrically conducting plates on the surface of the antenna housing.

To further optimize the ICP source 12, electrically conductive plates 50 may be added to the surface of housing 18, as shown in FIG. 5. Plates 50 may be electrostatically floating or grounded on the surface of housing 18. Plates 50 may comprises aluminum to minimize eddy current heating and losses. Similar to contouring dielectric capping plate 28, plates 50 can be used to tailor the ion flux uniformity at the wafer. Plate 50 may also be used to reduce the electrostatic coupling between the antenna and the plasma by ensuring that there is no electric field directly above the antenna 14. A drawback to using plates 50 is that some eddy current heating loss occurs.

Figure 6:
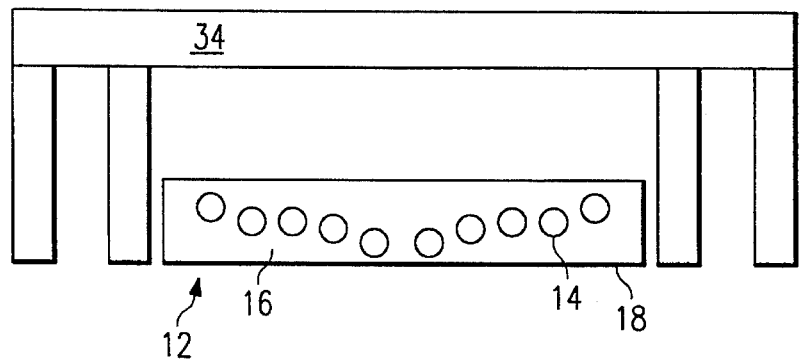
FIG. 6 illustrates an alternative configuration of the plasma source having a contoured antenna.

Several optimizations can be made to antenna 14 to improve process uniformity. For example, the diameter of and number of turns in the antenna 14 may be scaled with wafer diameter and chamber size. Furthermore, antenna 14 may be planar as indicated in FIG. 1 or it may be contoured in order to provide better process uniformity for a particular process chamber. One example of a contoured antenna is the conical antenna 14 shown in FIG. 6. As shown in FIG. 6, the innermost turns of antenna 14 are further away from the chuck 34 than the outermost turns.

Figure 7:
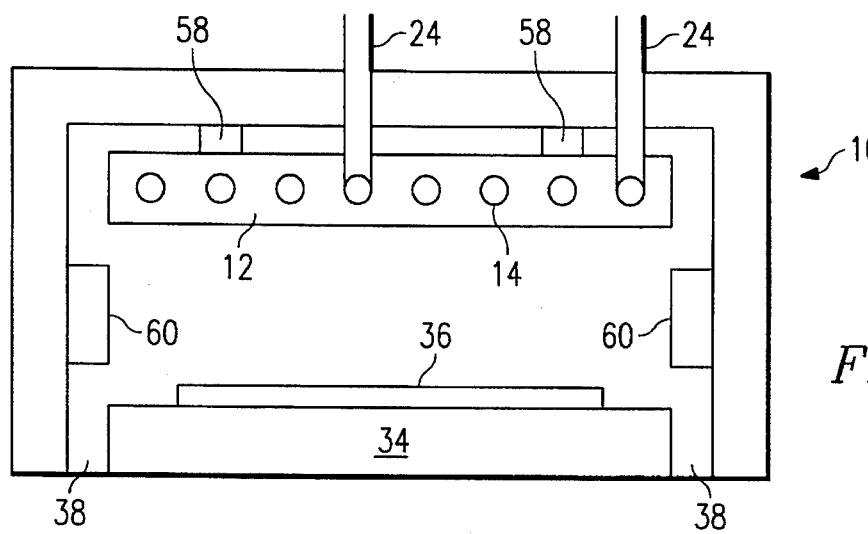
FIG. 7 illustrates a mechanism for adjusting the spacing between the disclosed plasma source and the wafer chuck.

If desired, the spacing between the wafer 36 and the housing 18 can be designed to be adjustable. Accordingly, the spacing between the wafer 36 and the housing 18 could be adjusted to optimize process uniformity and minimize wafer 36 heating due to electromagnetic fields. For example, the spacing may be varied by incorporating spacers 58 between the ICP 12 and the upper wall of the process chamber 10, as shown in FIG. 7. In addition, a set of multi-polar magnets 60 around the periphery of process chamber 10 may be provided to generate a multipolar magnetic field to improve plasma confinement and extend operation to lower pressures.

Another optimization technique involves operating the ICP source 12 in a time-modulated power mode in which the input RF power to the antenna 14 is time modulated. For example, a square wave modulation of the power may be used. Time modulation is useful for optimizing the mix of species in the plasma discharge. Time modulation has been shown to be beneficial for reactive ion etching and electron cyclotron resonance etching systems.

Figure 8:
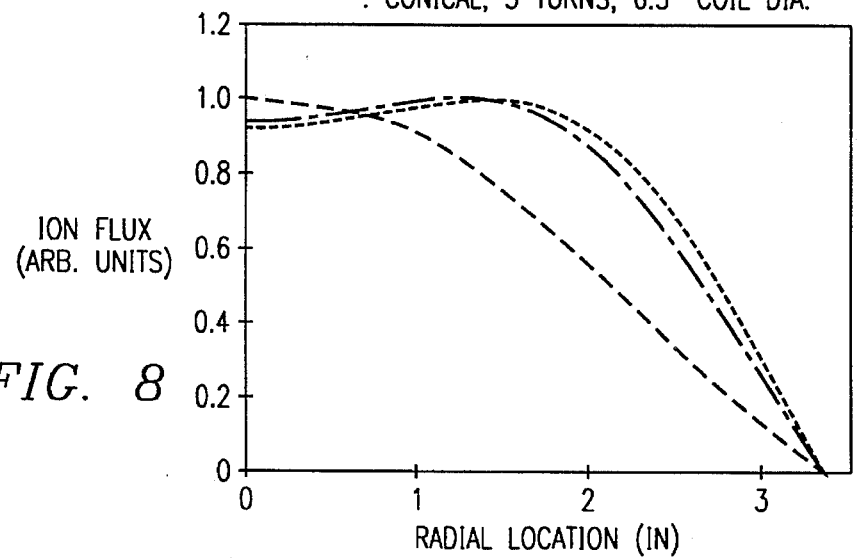
FIG. 8 is a graph of the effects of antenna geometry on ion flux distribution at the wafer.

FIGS. 8–12 illustrate the effects on ion flux density for various geometric factors. FIG. 8 illustrates the effect of antenna geometry on the ion flux distribution at the wafer. Simulations were performed on a 6.5 inch diameter process chamber using an argon plasma at 4 mTorr and an RF power ranging from 200–1500 W. Increasing the overall antenna diameter from 3 in. to 6.5 in. causes the standard deviation to reduce from 40% to 21% over a 150 mm measurement diameter. Further changing the shape of the antenna from planar to contoured, so that the innermost and outermost turns are located 1.5 in, and 0.5 in respectively from the surface of the dielectric capping plate 28, reduces the standard deviation to 17%.

Figure 9:
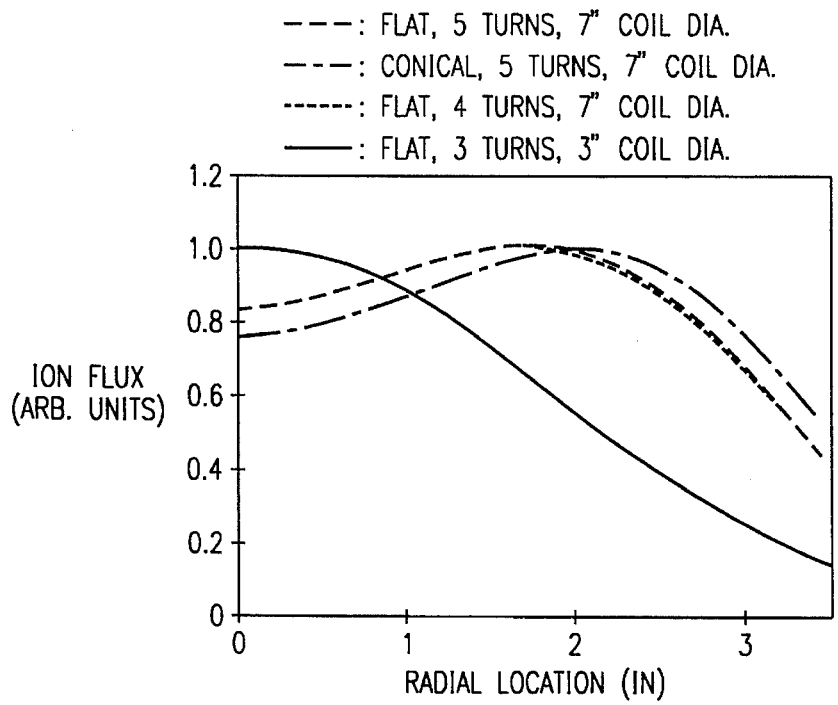
FIG. 9 is a graph of the effects of antenna geometry on ion flux distribution at the wafer.

FIG. 9 illustrates the effect of additional antenna geometries on the ion flux distribution at the wafer. Enlarging the chamber 10 to 8.75 in., while retaining the antenna diameter at 3 in. has only a minor impact on the uniformity. Merely increasing the chamber 10 diameter reduces the standard deviation from 40% to 30%, but simultaneously increasing the antenna diameter to 7 in. reduces the standard deviation to 5%. Decreasing the number of turns from 5 to 4 has no appreciable effect on the ion flux uniformity. Accordingly, decreasing the number of turns is desirable, since it lowers the inductance of the antenna thus making RF tuning easier. Changing the shape of the antenna from planar to contoured, so that the innermost and outermost turns are located 1.5 in, and 0.5 in. respectively from the surface of the dielectric capping plate 28, increases the ion flux at the edge of the wafer relative to the center of the wafer.

Figure 10:
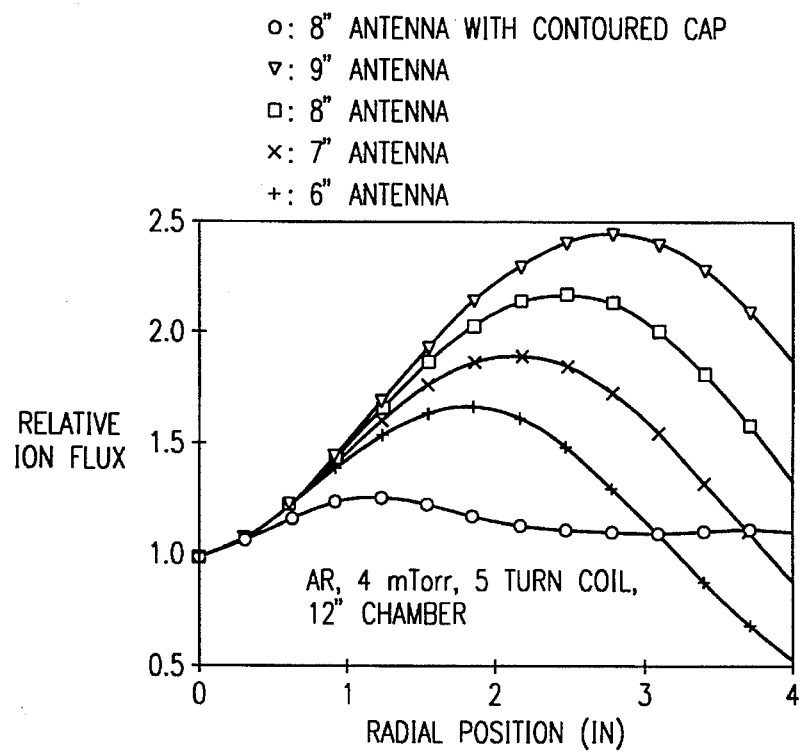
FIG. 10 is a graph of the effects of the shape of the dielectric capping plate on ion flux distribution at the wafer.

FIG. 10 illustrates the effect of the shape of the dielectric capping plate 28 on the ion flux distribution at the wafer. The chamber 10 diameter is 12 in. and the gap between the antenna and the wafer is 2 in. Contouring the dielectric capping plate 28 has the same effect as contouring the antenna 14 (i.e., the ion flux increases at the edge of the wafer relative to the center of the wafer). Contouring the dielectric capping plate affects the plasma distribution in two ways: contouring alters the shape of the plasma generation volume and also affects the electromagnetic field distribution in the plasma. The ability to tailor the ion flux uniformity also allows compensation for gas flow effects. From manufacturing point of view, contouring the dielectric capping plate 28 is easier than contouring the antenna 14.

Figure 11:
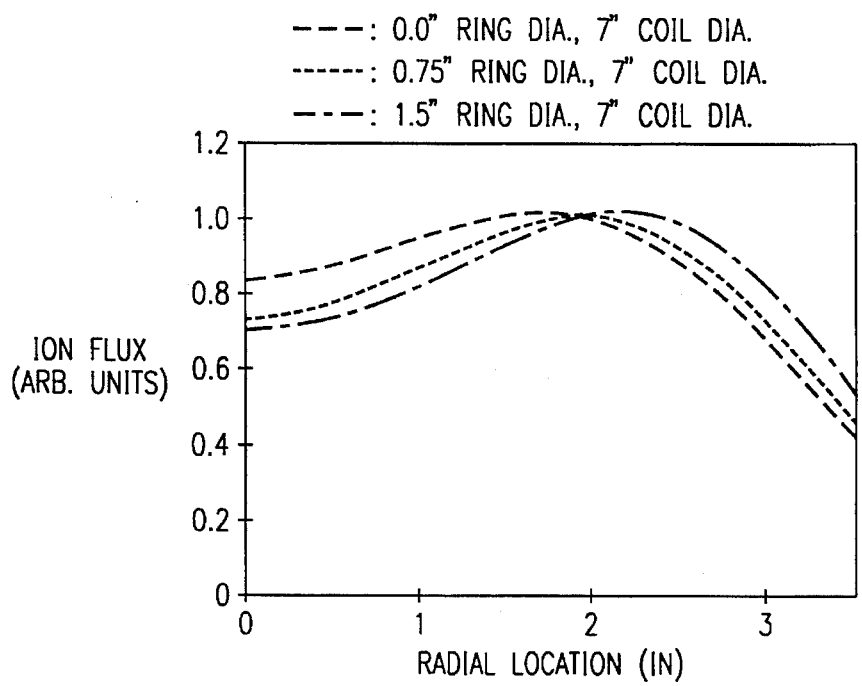
FIG. 11 is a graph of the effects of electrically conducting plates on ion flux distribution at the wafer.

FIG. 11 illustrates the effect of electrically conducting rings on the ion flux distribution at the wafer. Simulation was performed assuming a planar antenna having five turns and an overall diameter of 7 in. in a chamber 10 of 8.75 in. Electrically conducting rings 50 have a similar effect as contouring the dielectric capping plate. Rings 50 affect the electrostatic and electromagnetic field distribution.

Figure 12:
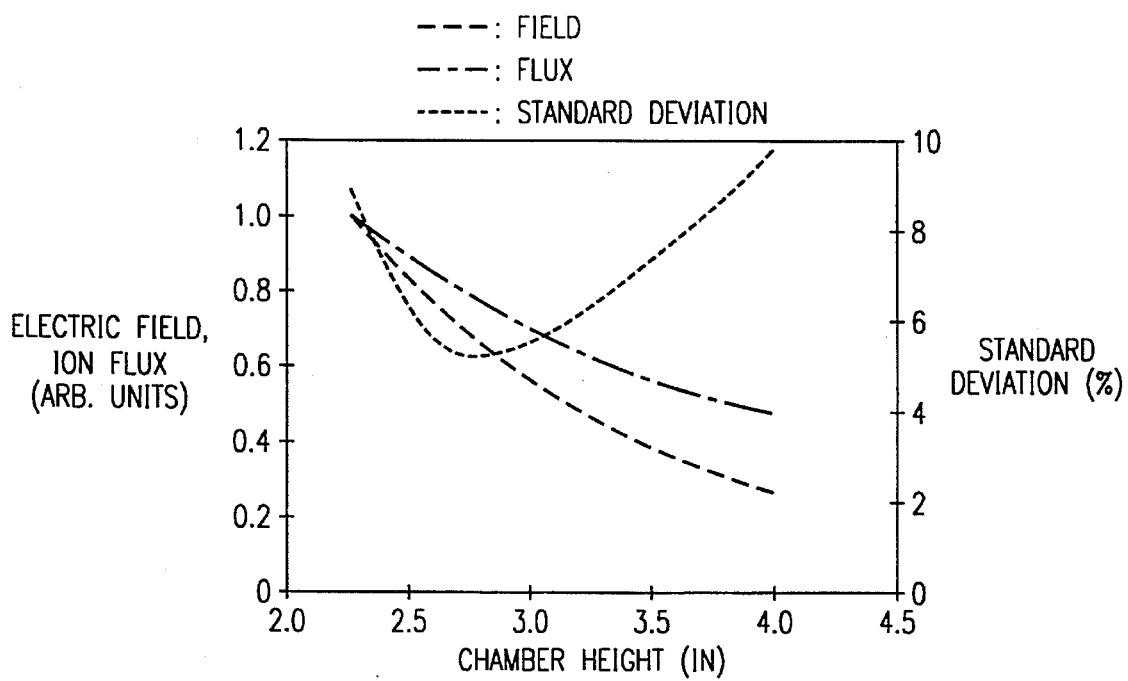
FIG. 12 is a graph of the effects of chamber height on the electric field, ion flux, and the ion flux uniformity at the wafer.

FIG. 12 illustrates the effect of chamber height on the electric field, the ion flux and the ion flux uniformity at the wafer. Simulation was performed based on a planar antenna having 5 turns and an overall diameter of 7 in. in a chamber 10 having a diameter of 8.75 in. Undesirable wafer heating due to the residual electromagnetic fields at the wafer can easily be reduced without substantially altering the ion flux by merely increasing the chamber 10 height slightly. For a given antenna configuration and chamber diameter there is an optimum chamber height for the best ion flux uniformity.

Although the present invention and its advantages have been described in detail, it, should be understood that various changes, substitutions and alterations can be made herein without departing from the spirit and scope of the invention as defined by the appended claims.

What is claimed is:

1. A method for incorporating an inductively coupled plasma source in a plasma processing chamber comprising the steps of:

providing a plasma processing chamber having a chuck for holding a wafer; encapsulating a spiral antenna in an epoxy;

surrounding said antenna and epoxy with a structurally rigid housing; hermetically sealing said epoxy;

attaching said housing to an internal wall of said plasma processing chamber; and providing a dielectric capping plate to a side of said housing.

2. The method of claim 1, further comprising the steps of supplying RF power to said spiral antenna; and providing at least one process gas to said plasma processing chamber to form a plasma.

3. The method of claim 2, further comprising the step of time modulating the RF power supplied to said spiral antenna.

4. The method of claim 1, further comprising the step of placing spacers between said housing and said internal wall to adjust the spacing between said housing and said chuck.

5. The method of claim 1, further comprising the step of contouring said dielectric capping plate.

6. The method of claim 1, further comprising the step of contouring said spiral antenna into a conical shape.

7. The method of claim 1, further comprising the step of placing electrically conductive plates on said side of said housing.

* * * * *